(12) United States Patent
Doris et al.

(10) Patent No.: US 7,488,658 B2
(45) Date of Patent: Feb. 10, 2009

(54) STRESSED SEMICONDUCTOR DEVICE STRUCTURES HAVING GRANULAR SEMICONDUCTOR MATERIAL

(75) Inventors: Bruce B. Doris, Brewster, NY (US); Michael P. Belyansky, Bethel, CT (US); Diane C. Boyd, Lagrangeville, NY (US); Dureseti Chidambarrao, Weston, CT (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 11/531,372

(22) Filed: Sep. 13, 2006

(65) Prior Publication Data

US 2008/0064172 A1   Mar. 13, 2008

Related U.S. Application Data

(62) Division of application No. 10/707,018, filed on Nov. 14, 2003, now Pat. No. 7,122,849.

(51) Int. Cl.
*H01L 21/336* (2006.01)

(52) U.S. Cl. .................. 438/296; 438/199; 438/275; 438/287; 438/299; 438/301; 257/E21.205

(58) Field of Classification Search ............ None
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |

(Continued)

FOREIGN PATENT DOCUMENTS

JP   64-76755   3/1989

OTHER PUBLICATIONS

Kern Rim, et al., "Transconductance Enhancement in Deep Submicron Strained-Si n-MOSFETs", International Electron Devices Meeting, 26, 8, 1, IEEE, Sep. 1998.

(Continued)

*Primary Examiner*—N Drew Richards
*Assistant Examiner*—Kyoung Lee
(74) *Attorney, Agent, or Firm*—Joseph P. Abate

(57) ABSTRACT

A method of fabricating a semiconductor device structure, includes: providing a substrate, providing an electrode on the substrate, forming a recess in the electrode, the recess having an opening, disposing a small grain semiconductor material within the recess, covering the opening to contain the small grain semiconductor material, within the recess, and then annealing the resultant structure.

8 Claims, 4 Drawing Sheets

U.S. PATENT DOCUMENTS

| | | | |
|---|---|---|---|
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,271,573 B1 * | 8/2001 | Suguro | 257/407 |
| 6,274,444 B1 | 8/2001 | Wang |
| 6,281,532 B1 | 8/2001 | Doyle et al. |
| 6,281,559 B1 | 8/2001 | Yu et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,534,390 B1 | 3/2003 | Chong et al. |
| 6,621,392 B1 | 9/2003 | Volant et al. |
| 6,635,506 B2 | 10/2003 | Volant et al. |
| 6,717,216 B1 | 4/2004 | Doris et al. |
| 6,787,827 B2 | 9/2004 | Inumiya et al. |
| 6,825,529 B2 | 11/2004 | Chidambarrao et al. |
| 6,831,292 B2 | 12/2004 | Currie et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0009784 A1 | 7/2001 | Ma et al. |
| 2001/0039107 A1 | 11/2001 | Suguro |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2002/0142566 A1 | 10/2002 | Ravi et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2004/0113174 A1 | 6/2004 | Chidambarrao et al. |
| 2004/0113217 A1 | 6/2004 | Chidambarrao et al. |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |

OTHER PUBLICATIONS

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers", Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000 IEEE, pp. 151-154.

S. Shimizu, et al.—"Gate Electrode Engineering By Control Of Grain Growth For High Performance And High Reliable 0.18 um Dual Gate CMOS"—1997 Symposium on VLSI Technology Digest of Technical Papers—pp. 107-108.

K. Ota, et al.—"Novel Locally Strained Channel Technique For High Performance 55nm CMOS"—International Electron Devices Meeting 2002. IEDM—Technical Digest—IEEE 2002—pp. 27-30.

* cited by examiner

STRESSED SEMICONDUCTOR DEVICE STRUCTURES HAVING GRANULAR SEMICONDUCTOR MATERIAL

This is a divisional application of U.S. application Ser. No. 10/707,018, filed Nov. 14, 2003, now U.S. Pat No. 7,122,849, the entire disclosure of which is incorporated herein by reference.

The present invention relates to semiconductor device structures, such as a CMOS device structure including both nFET and pFET devices.

BACKGROUND OF INVENTION

Mobility enhancements are important to future semiconductor, e.g. CMOS device technologies. Performance improvements from conventional process technologies are becoming extremely difficult to achieve. Methods to stress Si channels include: using SiGe which imparts stress from the bottom of the channel; different shallow trench isolation (STI) material choices which impart stresses from various sides, and SiN etch stop layers which also impart longitudinal stress from the sides. Drawbacks from the SiGe buffer layer or implanted-anneal-buffer approach with a strained Si cap layer are well known. Drawbacks include dislocations that impact yield severely, along with significant difficulty controlling As diffusion enhancements. Further, the process is quite complicated and costly. The STI approach is less costly but is not self-aligned to the gate and has RX size sensitivity. The less costly approach of using nitride etch stop layers to create stress does produce some benefit, but the benefit is believed to be relatively marginal.

SUMMARY OF INVENTION

The present invention improves device performance using channel mobility enhancement. The present invention improves mobility from the top of the channel by using the stress properties of properly modulated polysilicon gate stacks. Prior to the prevent invention these stress properties were very difficult to control. However, the present invention includes a method and structure which use small grain polysilicon to control stress properties. The present invention provides a method and a structure to impart compressive stress to the pFET channel and a tensile stress to the nFET channel. Other embodiments include imparting compressive stress to the pFET channel while preventing compressive stress from being imparted to the nFET channel. Another embodiment of this invention includes imparting tensile stress to the nFET channel while preventing the tensile stress from being imparted to the pFET channel.

The method of the present invention disposes (e.g., deposits) small grain poly-Si films in gate electrode stacks, which films become highly tensile as a result of annealing. The tensile film stress can be suppressed by annealing with a low temperature deposited SiN film disposed on top of the poly-Si film.

It is a principal object of the present invention to enhance channel mobility in semiconductor devices.

According to the present invention, a method of fabricating a semiconductor device structure includes providing a substrate; providing an electrode on the substrate; forming a recess in the electrode, the recess having an opening; disposing a small grain semiconductor material within the recess; covering the opening to contain the small grain semiconductor material within the recess, and then annealing the resultant structure. The present invention also includes a semiconductor device structure.

Further and still other objects of the present invention will become more readily apparent in light of the following detailed description when taken in conjunction with the accompanying drawing figures.

DESCRIPTION OF THE PREFFERRED EMBODIMENTS

Figure 1:
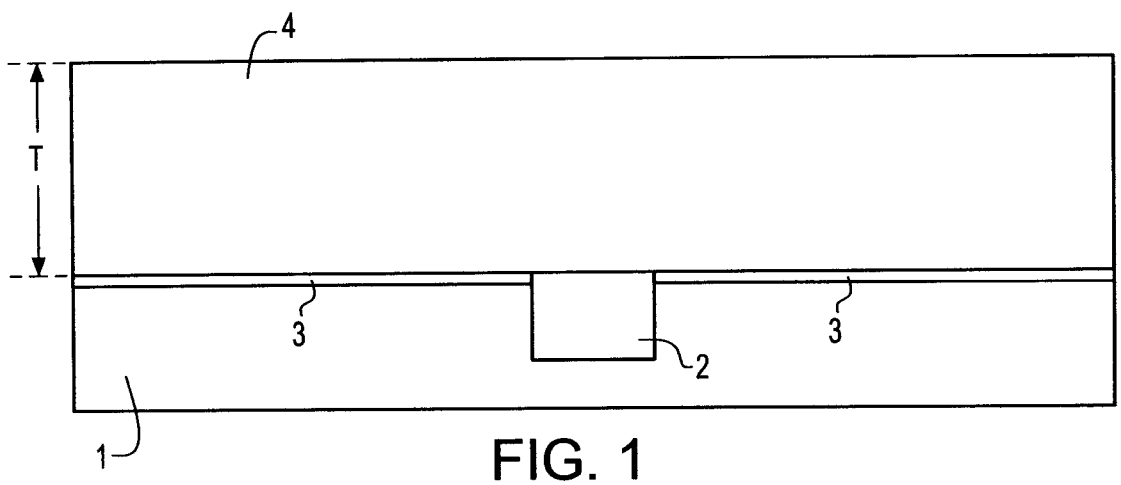
FIGS. 1-9 are side schematic views of process steps according to a preferred embodiment of the present invention.

Turning now to the figures, and FIG. 1 in particular, a semiconductor substrate 1 is provided. The semiconductor substrate is a bulk Si substrate, an SOI substrate, or a stressed (strained) Si substrate. Alternatively, the substrate is a hybrid substrate which includes more than one surface orientation. The substrate alternatively includes a semiconductor material other than Si, such as Ge or any combination of Group III-V elements or Group II-V elements.

After an initial substrate cleaning procedure (conventional), an isolation scheme is carried out. As is well known in semiconductor manufacturing, the isolation scheme is used to separate selected devices electrically from each other. The isolation scheme may be a standard or a modified shallow trench isolation (STI) scheme. The STI 2 is shown in FIG. 1. Alternatively, the isolation is accomplished using a LOCOS process or mesa isolation scheme, as is well known in the art of fabricating semiconductor devices. For various known or conventional processes for fabricating semiconductor devices, see *VLSI Technology*, $2^{nd}$ Edition, by S. M. Sze, (McGraw Hill Publishing Co., 1988).

After isolation 2 is formed, a conventional gate oxide pre-cleaning process is performed. As is the case in high performance logic fabrication processes, various conventional gate oxide processes may be used to fabricate devices having different gate oxide thicknesses. The gate oxide 3 is formed, for example, using a conventional thermal oxidation process. The oxide 3 is formed using $N_2O$, NO, $O_2$ or any combination of them. The oxide may be nitridized using a conventional plasma process. Alternatively, the gate oxide may be formed using a base oxide followed by deposition of a high k gate dielectric such as aluminum oxide, or hafnium oxide, or another high k gate dielectric. The gate dielectric material 3 has an approximately (±10%) uniform thickness in the range of about (±10%) 0.6 nm to about 7 nm.

Next, a film 4 is deposited over the entire wafer structure 1, 2, 3. The film 4 is used as a disposable (removable) or semi-disposable gate electrode material. In a preferred embodiment, the film 4 includes a polysilicon (poly Si) material having an approximately uniform thickness or height (T) in the range of about 80 nm to about 150 nm. A deposition technique such as low pressure chemical vapor deposition (LPCVD) or rapid thermal chemical vapor deposition (RPCVD) is used to deposit the removable gate electrode material 4. The resulting structure is shown in FIG. 1. The poly Si layer 4 preferably has a standard grain size in a range of about one nm to about 40 nm.

Figure 2:
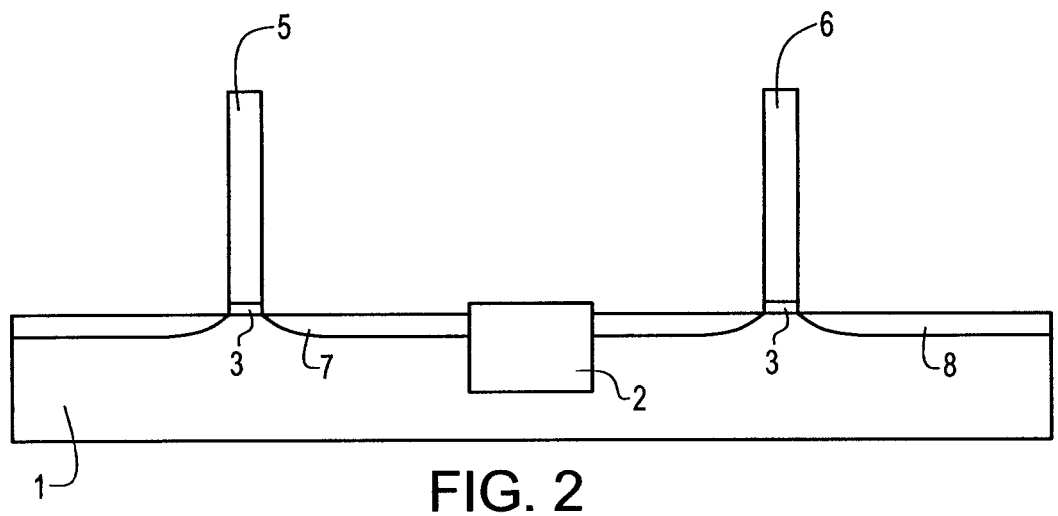

Next, a conventional lithography process is used to pattern photoresist images on the top of the removable gate electrode material 4. The photoresist images, not shown in the figures, are used to transfer desired features into the removable gate electrode material 4 by using a conventional dry etching process. The dry etching process includes or several chemistries capable of etching the removable gate electrode material 4 selectively with respect to the gate oxide material 3. The structure shown in FIG. 2 shows the fully patterned removable gate electrode 5 for a nFET gate stack 3,5 and a removable gate electrode 6 for a pFET gate stack 3,6.

A conventional gate reoxidation process, not shown in the figures, is then used, as is commonly done in high performance logic manufacturing processes. The reox is formed by using a thermal oxidation process to achieve an approximately uniform thickness from about one nm to about 7 nm. Following the reox process, a block mask is patterned over the pFET regions, using a conventional photolithography process. The block (e.g., resist) mask (not shown in the figures) is used to block or prevent the pFET regions from being implanted, while the appropriate nFET regions are being implanted. The nFET extensions 7 and halos (not shown) are implanted using a low energy As and B implant, respectively. The resist mask is then removed using a dry or wet process. Another block mask (not shown) is patterned over the nFET regions. The pFET extensions 8 and halos (not shown) are implanted using a low energy $BF_2$ or B implant and As implant, respectively. The extension implant profiles 7,8 for the nFET and the pFET are shown in FIG. 2.

Figure 3:
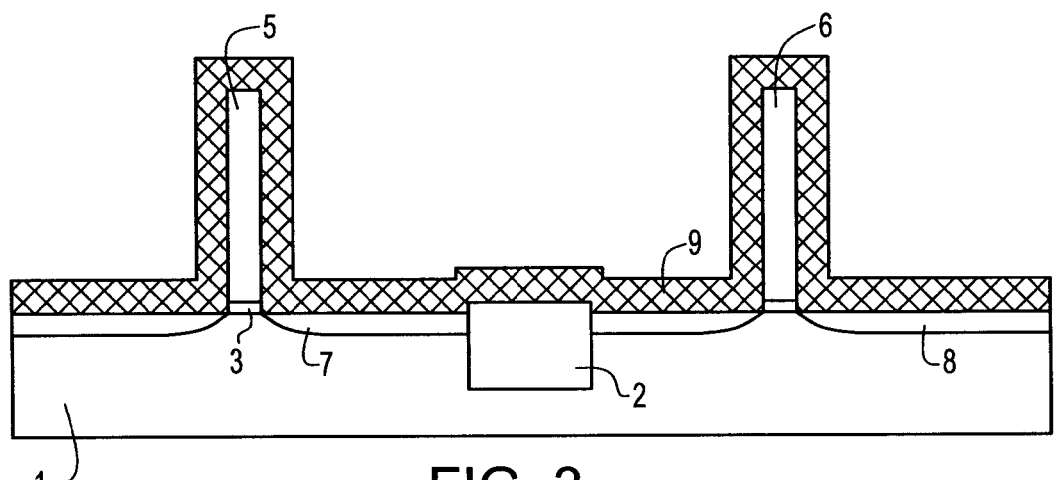

After the extension and halo implantation, a dielectric liner layer 9 is formed over the entire wafer structure (FIG. 3). The dielectric film to be used as the liner layer 9 is preferably SiN which is deposited by CVD or RTCVD or any other suitable deposition technique. A purpose of the liner layer 9 is to provide a CMP stop layer for the next process. Additionally, the SiN liner 9 will be etched, at a later point in the process flow, to form a source-drain spacer. The resulting structure is shown in FIG. 3.

Figure 4:
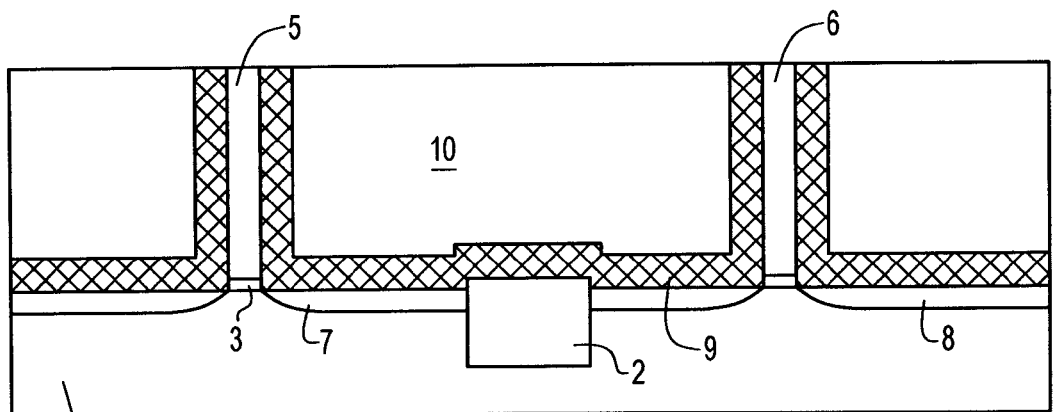

The next step in the process flow is to deposit an oxide film 10. The oxide film 10 is deposited and planarized using chemical mechanical polishing (CMP). The film 10 is deposited using, for example a high density plasma (HDP) process. The top of the liner 9 over the removable gate electrode 5 is removed by using a dry etching process that is capable of etching silicon nitride but does not etch appreciable amounts of oxide or poly Si. The planarized oxide film 10 and SiN liner 9 structure is shown in FIG. 4, after the top portion of the liner layer 9 has been removed.

Figure 5:
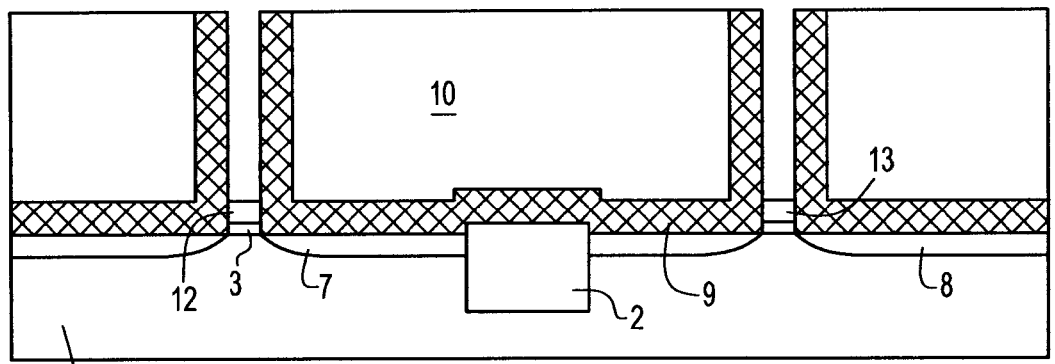

An important aspect of this invention is that, at this point in the inventive process flow, a gate recess process is used to remove the poly Si, either completely or partially, from the gate electrodes 5, 6. A preferred embodiment in which the poly-Si is partially removed is shown in FIG. 5. The poly Si is recessed using any suitable dry or wet etch process. A portion 12 and a portion 13 of the original poly Si is left remaining, and has an approximately uniform thickness in a range of about one nm to about 20 nm. A recessed portion 12 of the nFET gate electrode and a recessed portion 13 of the pFET gate electrode are shown in FIG. 5. In another embodiment (not shown), the poly Si is completely removed. If this embodiment is used, then a conventional gate oxide pre-clean process followed by a conventional gate oxidation process is next performed.

Figure 6:
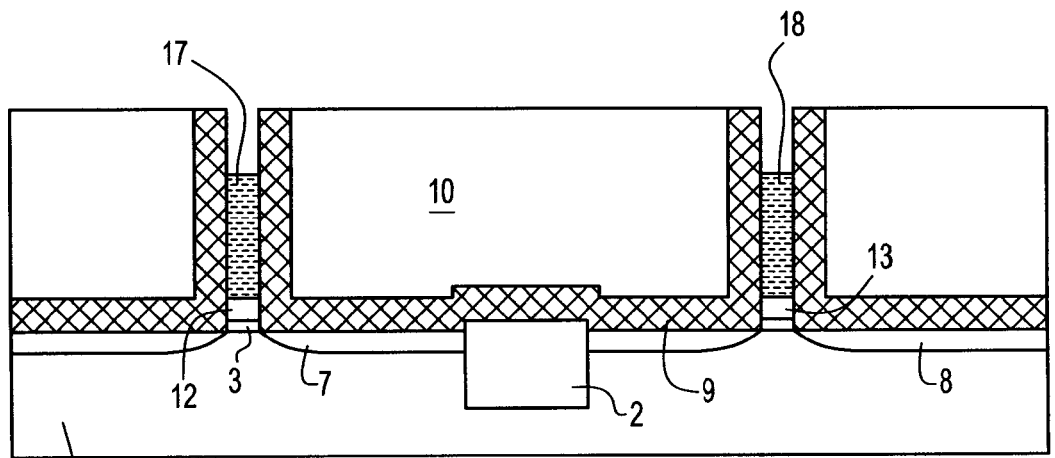

Another important aspect of this invention is that, following the gate recess process, a small grain poly Si is deposited over the entire wafer. Small grain polysilicon is known from Shimizu, S. et al. *Proceedings of the 1997 Symposium on VLSI Technology*, Kyoto, Japan 10-12 Jun. 1997, and also from *Silicon Processing for The VLSI Era*, Vol 1-Process Technology, by S. Wolf, 1999. The grain structure preferably is in a range of about one nm to about 50 nm. A more preferable grain size is a substantially uniform size in a range of about five nm to 30 nm. The polySi is deposited by RTCVD or LPCVD. Next, the polySi is planarized and recessed from the top of the oxide layer 10 using, for example, CMP and a dry etch. Both CMP and dry etch processes are capable of removing the poly Si selectively relative to the $SiO_2$ layer 10. After CMP and dry etch, the inventive gate electrode structure 14, 12 for the nFET and the inventive gate electrode structure 13, 18 for the pFET are shown in FIG. 6.

Figure 7:
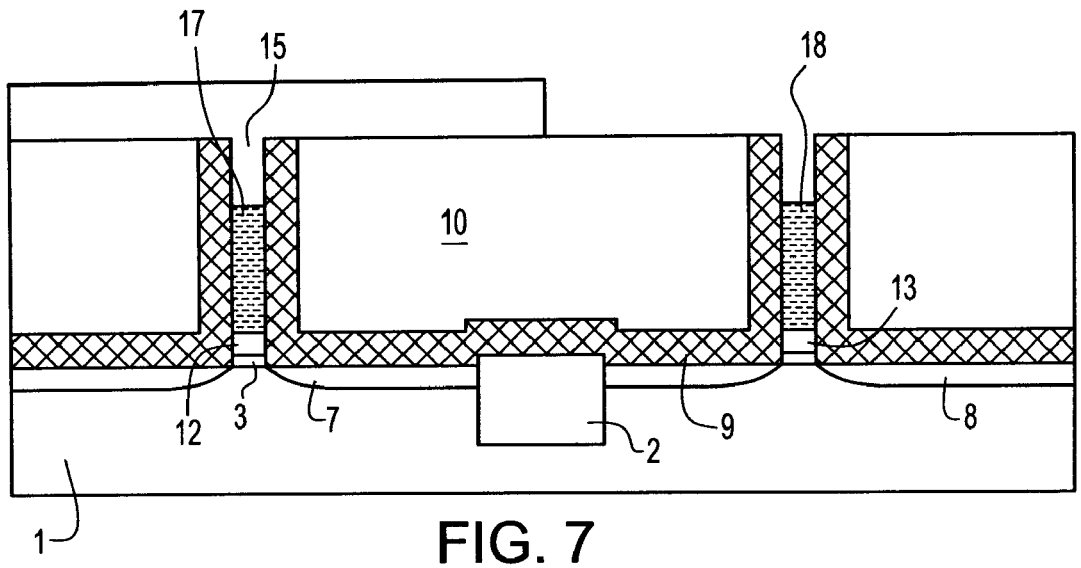

At this point in the inventive method, a hard mask 15 shown in FIG. 7 is patterned over the nFET region. The mask 15 is patterned using a dielectric film including SiN and a conventional photolithography procedure. The hard mask 15 is deposited using a low temperature deposition process such as plasma enhanced chemical vapor deposition with a temperature in the range of about 350° C. to about 700° C. Preferably, the material which forms the hard mark 15 is deposited at a temperature below 550° C. or lower, to prevent re-growth of the poly-Si grains. The whole structure is next subjected to an anneal using a temperature from about 500° C. to about 600° C. for about one hour. Alternatively, a rapid thermal anneal may be carried out at about 700° C. to about 1000° C. for about one second to about seven seconds. In another embodiment, the structure 12, 14 is annealed at a future point in the process. The small grain poly Si remains small, in the range preferably of about five nm to about 30 nm for the nFET gate electrode portion 17 because the SiN cap layer 15 is present. However, the grains in the pFET gate electrode portion 18 grow significantly to grain sizes of greater than about 30 nm.

The present inventors believe that the inventive process (e.g., with respect to FIG. 7) represents a notable departure from conventional process technology. If the small grain poly Si is subjected to the standard thermal budget, then the poly Si grain growth causes a severe increase in tensile stress. The tensile stress creates a compressive stress in the channel region which degrades electron mobility and limits the performance for the nFET. See the simulations of FIG. 10. The inventors believe that the grain growth and resulting severe increase in tensile stress is almost completely eliminated by annealing with the SiN hard mask 15 disposed over the nFET region. The grain structure can be optimized for each device independently by depositing the small grain poly Si into the recess and annealing the nFET with the SiN hard mask. This step appears to result in a notable improvement in nFET device performance.

Figure 8:
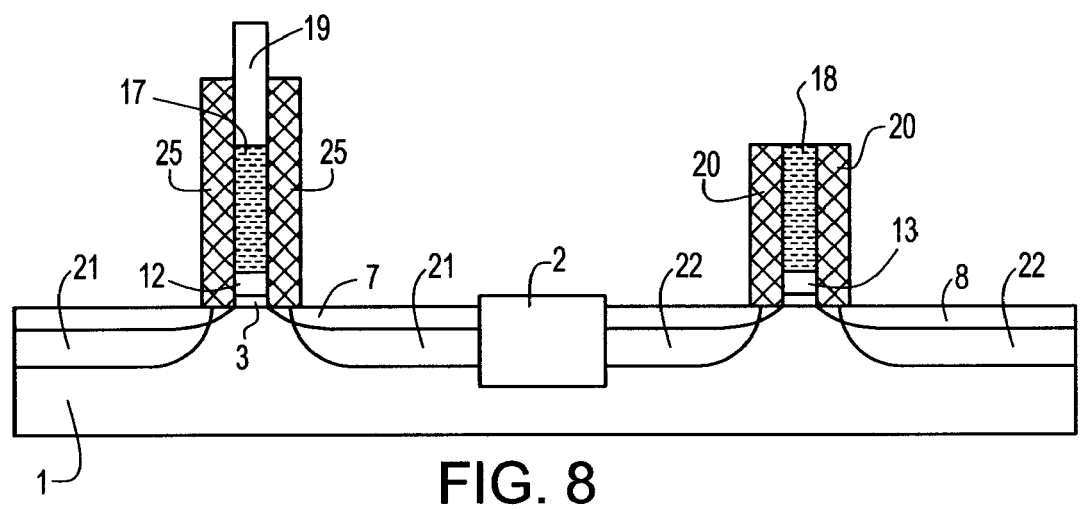

The next step in the inventive process is to remove the SiN hard mask 15 from the entire horizontal part of the oxide film 10 or from the entire horizontal part (except over the portion 17, as shown in FIG. 8). Because the poly Si was recessed as described previously, a portion 19 of the hard mask 15 is left remaining (disposed) in the recessed hole as shown in FIG. 8. The purpose of the structure 19 is to prevent the grains from growing during subsequent conventional thermal cycles common in standard state-of-the art semiconductor manufacturing process technology. After the SiN etch, the oxide film 10 is removed using a suitable dry or wet etch process capable of removing the $SiO_2$ film selectively relative to the SiN and the poly Si materials. A dry directional etch process is next performed on the liner layer 9 to form the spacers 20, 25 as shown in FIG. 8. Although not essential for the present invention, the spacers 20 of the pFET and the spacers 25 of the nFET may have differing heights as shown. A similar block mask and implant process as was used to form the nFET and pFET extension regions 7, 8 is used to form the nFET source-drain regions 21 and the pFET source-drain region 22 shown in FIG. 8. A rapid thermal anneal is next performed to activate the junctions. Because the nFET continues to have the SiN layer 19 present, grain growth in the nFET gate is suppressed, thereby minimizing the tension in the gate electrode stack 3, 12, 17 and subsequent compression in the channel region below the stack.

Figure 9:
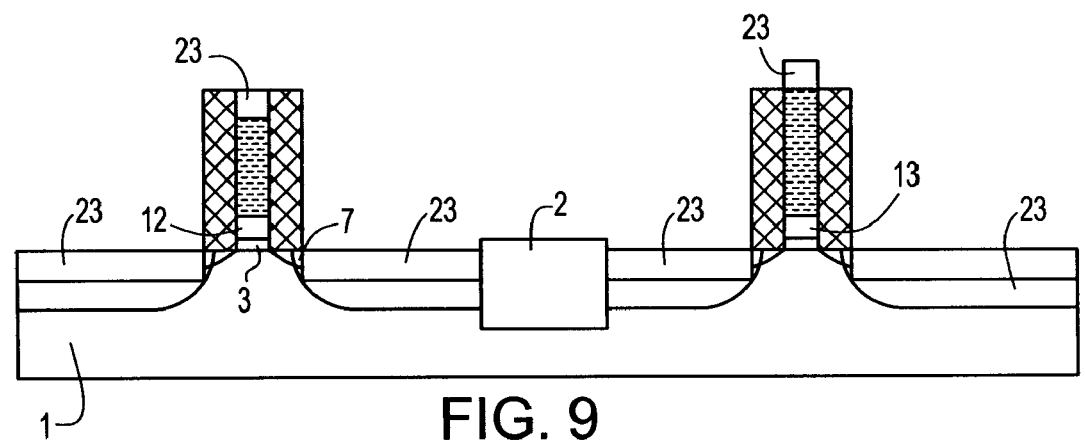

The remaining portion 19 over the gate electrode stack is next removed using a wet or dry etch process. Next, a silicide pre-cleaning process is carried out followed by a conventional silicide process. See FIG. 9 and silicide 23. Standard back-end-of-line processing is done including pre-metal dielectric deposition and planarization, contact etch, contact liner formation and contact formation, followed by metal wiring and final chip fabrication, all not shown.

Figure 10:
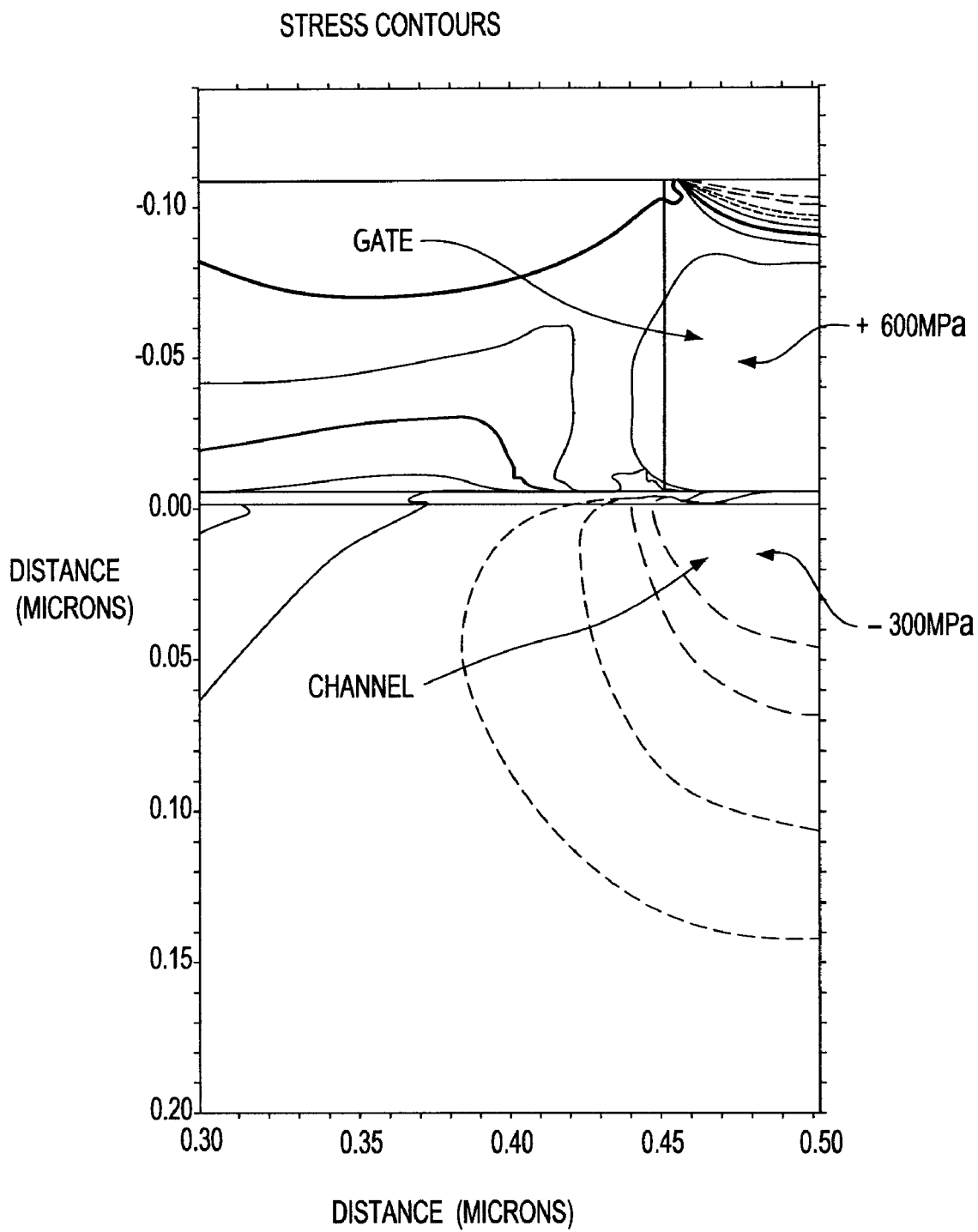
FIG. 10 is a diagram showing simulated stress contours in the gate and channel of the preferred inventive structure.

Simulation results indicate that the tensile stress level in uncapped polySi increases by about 600 MPa to about 1200 MPa as a result of annealing for about one hour at a temperature of about 600° C., while the capped polySi increases in tensile stress by only about 10 MPa. Our simulation results show that about 33% to about 50% of the stress in the gate material (with the opposite sign with respect to the gate stress) can be translated into the channel region. Thus, the uncapped gate stack imparts −200 MPa to −300 MPa, while the capped gate stack translates little or no stress into the channel region. One simulation of stress contours is shown in the diagram of FIG. 10.

While there has been shown and described what is at present considered the preferred embodiments of the present invention, it will be apparent to those killed in the art that various changes and modifications may be made therein without departing from the spirit and scope of the present invention which shall be limited only by the appended claims.

What is claimed is:

1. A method for fabricating a semiconductor device structure, comprising:
providing a substrate;
forming an nFET and a pFET on the substrate;
replacing portions of the gate electrodes from the nFET and said pFET with a small grained polysilicon;
covering the small-grained polysilicon of the nFET, and then heating the nFET and the pFET, so that an average diameter of the grains within the nFET is less than an average diameter of the grains within the pFET.

2. The method as claimed in claim 1, wherein said step of heating includes heating the nFET and the pFET to temperatures within a range of approximately 500° C. to approximately 600° C. for approximately one hour.

3. The method as claimed in claim 1, wherein the small-grained polysilicon has an average grain size in a range of about five nm to about 30 nm.

4. The method as claimed in claim 1, wherein said step of replacing includes removing the portions of the gate electrodes to form recesses, and then disposing the grained polysilicon within the nFET and pFET recesses.

5. The method as claimed in claim 1, wherein said step of replacing includes removing the entire portions of the gate electrodes to form recesses, and then depositing the small-grained polysilicon within the recesses.

6. The method as claimed in claim 1, wherein said step of covering includes disposing a mask over the grained polysilicon of the nFET, the mask consisting essentially of SiN.

7. The method as claimed in claim 1, further comprising forming spacers for the nFET and the pFET, the spacers having different heights.

8. The method as claimed in claim 1, further comprising providing spacers for the mFET and the pFET, the spacers for the pFET having heights which are less than heights of the spacers for the nFET.

\* \* \* \* \*